(12) United States Patent  
Kitada et al.

(10) Patent No.: US 6,706,615 B2
(45) Date of Patent: Mar. 16, 2004

(54) METHOD OF MANUFACTURING A TRANSISTOR

(75) Inventors: Mizue Kitada, Saitama (JP); Toshiyuki Takemori, Saitama (JP); Shinji Kunori, Saitama (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 10/401,672

(22) Filed: Mar. 31, 2003

(65) Prior Publication Data

US 2003/0203576 A1 Oct. 30, 2003

Related U.S. Application Data

(62) Division of application No. 09/793,964, filed on Feb. 28, 2001, now Pat. No. 6,573,559.

(30) Foreign Application Priority Data

Mar. 1, 2000 (JP) ....................................... 2000-055387

(51) Int. Cl.[7] ............................................... H01L 21/76
(52) U.S. Cl. ........................ 438/430; 438/404; 438/405
(58) Field of Search ................................ 438/430, 404, 438/405, 243, 129, 128, 268, 406

(56) References Cited

U.S. PATENT DOCUMENTS

| 5,168,331 A | 12/1992 | Yilmaz | 257/331 |
|---|---|---|---|
| 5,216,275 A | 6/1993 | Chen | 257/493 |
| 5,438,215 A | 8/1995 | Tihanyi | 257/401 |
| 5,883,411 A | 3/1999 | Ueda et al. | 257/331 |
| 5,973,257 A * | 10/1999 | Cantarini et al. | 438/406 |
| 5,985,698 A * | 11/1999 | Gonzalez et al. | 438/128 |
| 5,985,708 A | 11/1999 | Nakagawa et al. | 438/206 |
| 6,307,246 B1 * | 10/2001 | Nitta et al. | 438/268 |
| 6,498,061 B2 * | 12/2002 | Divakaruni et al. | 438/243 |
| 6,570,218 B1 * | 5/2003 | Bol | 257/328 |
| 6,573,154 B1 * | 6/2003 | Sridhar et al. | 438/430 |
| 6,573,559 B2 * | 6/2003 | Kitada et al. | 257/330 |
| 6,608,350 B2 * | 8/2003 | Kinzer et al. | 257/341 |

* cited by examiner

Primary Examiner—John Niebling
Assistant Examiner—Walter L. Lindsay, Jr.
(74) Attorney, Agent, or Firm—Armstrong, Kratz, Quintos, Hanson & Brooks, LLP.

(57) ABSTRACT

A technique for reducing an on-resistance of a transistor is provided. A power MOSFET of the present invention has a semiconductor material which is disposed under a polysilicon gate and composed of polysilicon into which impurities are doped at low concentration. Therefore, a depletion layer is expanded to the inside of the semiconductor material under the polysilicon gate. Since the electric field strengths are uniform from the surface of a drain layer to a depth of the bottom surface of the semiconductor material and a high electric field is not generated at one site, the avalanche breakdown voltage of the transistor is increased. Therefore, the concentration of impurities in drain layer can be made higher than that in a conventional transistor and thereby the on-resistance of the transistor 1 can be reduced.

14 Claims, 14 Drawing Sheets

METHOD OF MANUFACTURING A TRANSISTOR

This application is a division of 09/793,964 filed Feb. 28, 2001 now U.S. Pat. No. 6,573,559.

BACKGROUND OF THE INVENTION

1. Field of the Invention

The present invention relates to a transistor and a method of manufacturing the same. In particular, the present invention relates to a power MOSFET widely used in a power supply circuit or the like and a method of manufacturing the same.

2. Description of the Related Art

FIGS. 29 and 30 show a conventional trench type power MOSFET designated by reference numeral 101. FIG. 30 is a cross-sectional view taken along line X—X in FIG. 29. It is noted that like component members are designated by like reference numerals in FIGS. 29 and 30.

This power MOSFET 101 has a semiconductor substrate constituted by successively forming a drain layer 112 composed of an n⁻-type epitaxial layer and a P-body region 113 on an n⁺-type silicon substrate 111 as shown in FIG. 30.

A plurality of trenches having a rectangular cross section of which bottom portion reaches the drain layer 112 are formed in the P-body region 113 and disposed in parallel to each other. A p⁺-type diffusion region 116 in a predetermined depth from the surface of the P-body region 113 is formed at a position between adjacent trenches. An n⁺-type source region 130 is formed in the periphery of the p⁺-type diffusion region 116 and surrounding an aperture of the trench from the surface of the P-body region 113 to such a depth as not reaching the drain layer 112.

A gate insulating film 124 is formed on an inner peripheral surface and bottom surface of the trench. A polysilicon gate 127 is formed on a surface of the gate insulating film 124 so that the inside of the trench is filled and that its upper end is positioned higher than the lower end of the source region 130.

A PSG (phospho-silicate glass) film 131 is formed on top of the polysilicon gate 127. A source electrode film 137 composed of aluminum is formed so as to cover the PSG film 131 and the surface of the semiconductor substrate. The polysilicon gate 127 and the source electrode film 137 are electrically insulated from each other by the PSG film 131. Furthermore, a drain electrode film 193 is formed on the bottom surface of the semiconductor substrate.

In a power MOSFET 101 having this structure, when a voltage equal to a threshold voltage or higher is applied between the polysilicon gate 127 and the source electrode film 137 in a state that a high voltage is being applied between the source electrode film 137 and the drain layer 112, an inversion layer is formed at an interface between the gate insulating film 124 and the P-body region 113. Thus, a current flows from the drain to the source through the inversion layer.

The abscissa axis (E) of a graph in FIG. 30 represents an electric field strength when reverse bias voltage is applied between the source electrode film 137 and the drain layer 112. The ordinate axis (y) represents a position on a line starting at an origin and vertically reaching the n⁺-type silicon substrate 111 where the origin is the surface of the source region 130 in the power MOSFET 101 shown in FIG. 30.

Line Y—Y in FIG. 30 is a line starting at one point in the source region 130 and vertically reaching the n⁺-type silicon substrate 111 through the P-body region 113 and the drain layer 112 without passing through the p⁺-type diffusion region 116. A polygonal line (b) in FIG. 30 is a graph showing the relationship between a position on line Y—Y and the electric field strength thereat.

As shown in FIG. 30, the electric field strength E includes a high electric field intensively applied to a portion of a pn junction formed by the P-body region 113 and the drain layer 112. To secure a desired avalanche breakdown voltage by decreasing the electric field strength, the concentration of the drain layer 112 can be lowered so that the depletion layer can be easily expanded. In this case, however, a problem arises that the on-resistance of the power MOSFET 101 increases.

SUMMARY OF THE INVENTION

The present invention was accomplished to solve the above-described problem of the prior art. Accordingly, an object of the present invention is to provide a technique by which the on-resistance $R_{ON}$ of a transistor of the present invention can be made lower than that of a conventional one even when the transistor has a avalanche breakdown voltage equal to that of the conventional one.

To solve the above problem, a first aspect of the present invention is a transistor comprising a semiconductor substrate having a semiconductor layer, a drain layer of a first conductivity type disposed on the semiconductor layer and an opposite conductive region of a second conductivity type disposed on the drain layer, polysilicon containing impurities of the second conductivity type disposed in part of the drain layer, a gate trench disposed from a surface of the opposite conductive region to the polysilicon, a source region of the first conductivity type formed on the surface of the opposite conductive region at a position adjacent to the gate trench, a gate insulating film positioned on the inner surface of the gate trench and disposed over the drain layer, the opposite conductive region and the source region, and a gate electrode film disposed in the gate trench in tight contact with the gate insulating film and insulated from the polysilicon.

A second aspect of the invention is a transistor according to the first aspect, wherein the polysilicon and the gate electrode film are insulated from each other by the gate insulating film.

A third aspect of the invention is a transistor according to the first aspect, further comprising an insulating film which is disposed between the polysilicon and the drain layer and insulates the polysilicon from the drain layer.

A fourth aspect of the invention is a transistor according to the first aspect, wherein the semiconductor layer is of the first conductivity type.

A fifth aspect of the invention is a transistor according to the first aspect, wherein the semiconductor layer is of the second conductivity type.

A sixth aspect of the invention is a transistor comprising a semiconductor substrate having a semiconductor layer, a drain layer of a first conductivity type disposed on the semiconductor layer and an opposite conductive region of a second conductivity type disposed on the drain layer, a semiconductor material disposed in part of the drain layer and constituted so that a depletion layer can be formed therein, a gate trench disposed from a surface of the opposite conductive region to the semiconductor material, a source region of the first conductivity type formed on the surface of the opposite conductive region at a position adjacent to the gate trench, a gate insulating film positioned on the inner surface of the gate trench and disposed over the drain layer, the opposite conductive region and the source region, and a gate electrode film disposed in the gate trench in tight contact with the gate insulating film and insulated from the semiconductor material, wherein the semiconductor material is filled at the bottom of a deep trench disposed from the surface of the opposite conductive region to the inside of the drain layer, and the gate trench is formed by the surface of the semiconductor material and the inner peripheral surface of the deep trench.

A seventh aspect of the invention is a transistor according to the sixth aspect, wherein the semiconductor material and the gate electrode film are insulated from each other by the gate insulating film.

An eighth aspect of the invention is a transistor according to the sixth aspect, further comprising an insulating film provided on the inner wall surface and the bottom surface of the deep trench, and wherein the semiconductor material is filled at the bottom of the deep trench so as to come into tight contact with the insulating film.

A ninth aspect of the invention is a transistor according to the sixth aspect, wherein the semiconductor material is formed by epitaxial growth.

A tenth aspect of the invention is a transistor according to sixth aspect, wherein the semiconductor layer is of the first conductivity type.

An eleventh aspect of the invention is a transistor according to sixth aspect, wherein the semiconductor layer is of the second conductivity type.

A twelfth aspect of the invention is a method of manufacturing a transistor, comprising the steps of forming a deep trench in a semiconductor substrate having a drain layer of a first conductivity type and an opposite conductive region of a second conductivity type disposed on the drain layer from a surface of the opposite conductive region to the drain layer, filling a semiconductor material in the deep trench from the bottom surface of the deep trench to a depth not reaching the opposite conductive region to be constituted so that a depletion layer can be formed therein, forming a gate insulating film from the surface of the semiconductor material over the inner surface of the gate trench constituted by the surface of the semiconductor material and the deep trench, forming a gate electrode film in which impurities of the first conductivity type are diffused in the gate trench so as to come into tight contact with the gate insulating film, and forming a source region of the first conductivity type in the semiconductor substrate surface surrounding the gate trench.

A thirteen aspect of the invention is a method of manufacturing a transistor according to the twelfth aspect, wherein, the step of filling the semiconductor material in the deep trench comprises the steps of, forming an insulating film from the bottom surface of the deep trench to a depth not reaching the opposite conductive region, and forming the semiconductor material on the insulating film surface and filling the deep trench with the semiconductor material to the upper end of the insulating film.

A fourteenth aspect of the invention is a method of manufacturing a transistor according to the twelfth aspect, wherein the semiconductor material is formed by epitaxial growth and is composed of silicon containing impurities of the second conductivity type.

A fifteenth aspect of the invention is a method of manufacturing a transistor according to the twelfth aspect, wherein the semiconductor material is composed of polysilicon containing impurities of the second conductivity type.

According to a transistor of the present invention, polysilicon containing impurities is disposed under the gate trench filled with a gate electrode therein.

Therefore, the depletion layer is formed into the polysilicon under the gate electrode and is expanded from a region of the opposite conductivity type to a depth where the bottom surface of the polysilicon is positioned in the drain layer. Thus, the electric field strength in a depth direction inside the semiconductor substrate becomes uniform. Consequently, the electric field strength is weakened as compared with that in a conventional transistor since a high electric field is not intensively applied to a portion at a certain depth. Therefore, the avalanche breakdown voltage of the transistor becomes higher than that of a conventional one.

Since the concentration of impurities in the drain layer does not need to be lowered to secure a high avalanche breakdown voltage unlike in the case of a conventional transistor, the concentration of impurities in the drain layer can be made higher than that in the conventional one and thereby the on-resistance of the transistor can be reduced.

According to another transistor of the present invention, a semiconductor material in which a depletion layer can be formed is filled at the bottom of the deep trench. A gate insulating film is disposed in a gate trench constituted by the surface of the semiconductor material and the inner peripheral surface of the deep trench, and a gate electrode film is disposed on a surface of a gate insulating film so as to fill in the gate trench.

Therefore, the depletion layer is expanded from the opposite conductivity type region to a depth where the bottom surface of the semiconductor material is positioned. Therefore, electric field strengths in the depth direction in the inside of the semiconductor substrate become uniform.

Furthermore, according to a method of manufacturing a transistor of the present invention, a deep trench is formed and then a semiconductor material in which a depletion layer can be formed is filled at the bottom of the deep trench. Then, a gate insulating film is formed on the semiconductor material surface and an inner peripheral surface of a gate trench constituted by the semiconductor material surface and the inner peripheral surface of the deep trench. Then, a gate electrode film is formed in the gate trench so as to come into tight contact with the gate insulating film.

Therefore, since the polysilicon layer is easily formed under the gate electrode film in a state that the polysilicon layer and the gate electrode film are insulated from each other by the gate insulating film, the depletion layer can be formed in this polysilicon layer so that the electric field strengths in the drain layer can be made uniform.

DETAILED DESCRIPTION OF THE PREFERRED EMBODIMENTS

Figure 1:
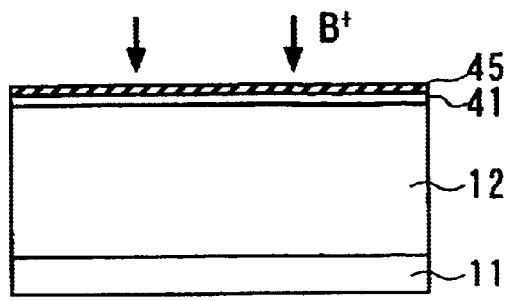
FIG. 1 is a cross-sectional view showing a process of forming a power MOSFET according to one embodiment of the invention.
Figure 2:
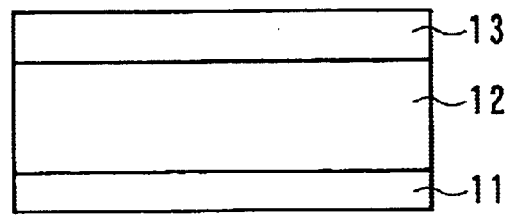
FIG. 2 is a cross-sectional view showing the subsequent process.
Figure 3:
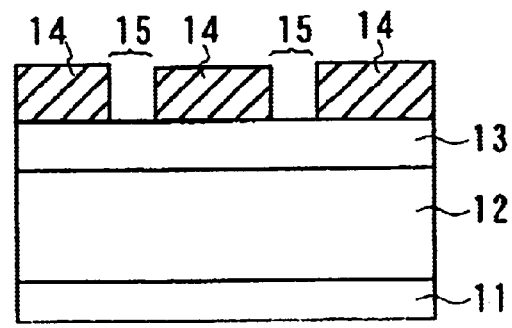
FIG. 3 is a cross-sectional view showing the subsequent process.
Figure 4:
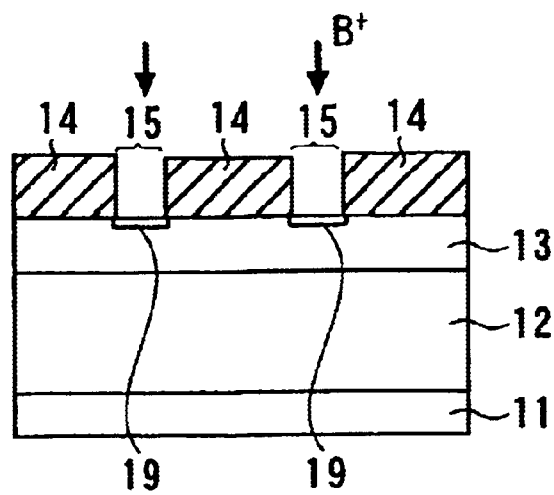
FIG. 4 is a cross-sectional view showing the subsequent process.
Figure 5:
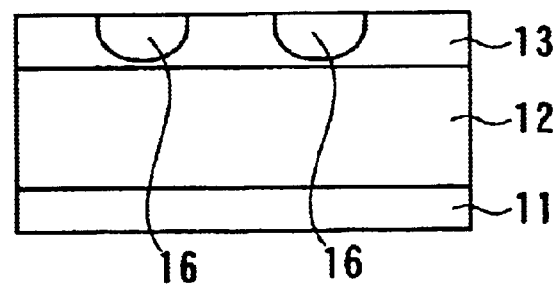
FIG. 5 is a cross-sectional view showing the subsequent process.

Embodiments of the present invention will be described below with reference to the drawings.

A method of manufacturing a trench type power MOSFET according to an embodiment of the invention will be described below with reference to FIGS. 1 to 21. It is noted that like component members are designated by like reference numerals throughout these figures.

First, a drain layer 12 composed of an n$^-$-type epitaxial layer having a thickness of 18.2 $\mu$m is formed on a surface of an n$^+$ silicon substrate 11 having a resistivity of 0.003 $\Omega$cm. After the layer is subjected to thermal oxidation to form an SiO$_2$ film 45 on the whole surface of the drain layer 12, boron ions (B$^+$) are implanted in the drain layer 12 via the SiO$_2$ film 45. Consequently, a p-type implantation layer 41 is formed near the surface in the drain layer 12 (refer to FIG. 1). Subsequently, the p-type implantation layer is diffused in the drain layer 12 by thermal process and thus a P-body region 13 is formed from the surface of the drain layer 12 to a depth of 1.2 $\mu$m (refer to FIG. 2).

Subsequently, a resist film 14 is formed. The resist film 14 has a plurality of slender apertures 15 formed in the surface thereof so that the apertures are disposed in parallel to each other at predetermined intervals (refer to FIG. 3). When boron ions (B$^+$) are implanted into the P-body region 13 from the apertures 15, a plurality of slender p$^+$-type implantation layers 19 are formed (refer to FIG. 4).

Subsequently, the resist film 14 is removed and thermal process is performed. Consequently, the p$^+$-type implantation layers 19 are diffused in the P-body region 13 and a plurality of slender p$^+$-type diffusion regions 16 are formed from the surface of the P-body region 13 to a depth of about 1.0 $\mu$m (refer to FIG. 5). These p$^+$-type diffusion regions 16 are disposed in parallel to each other.

Figure 6:
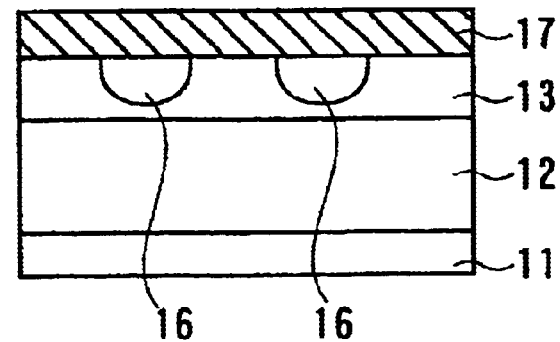
FIG. 6 is a cross-sectional view showing the subsequent process.
Figure 7:
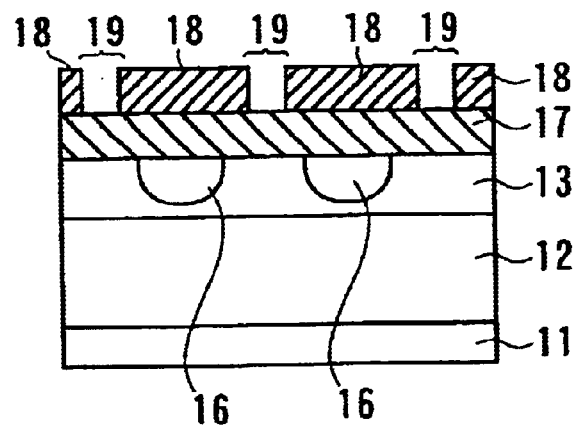
FIG. 7 is a cross-sectional view showing the subsequent process.

Then, a SiO$_2$ film 17 is formed on the whole surface by the CVD method (refer to FIG. 6). Subsequently, a resist film 18 in which the slender apertures 19 are formed at a position between the neighboring p$^+$-type diffusion regions 16 is formed on the surface of the SiO$_2$ film 17 (refer to FIG. 7).

Figure 8:
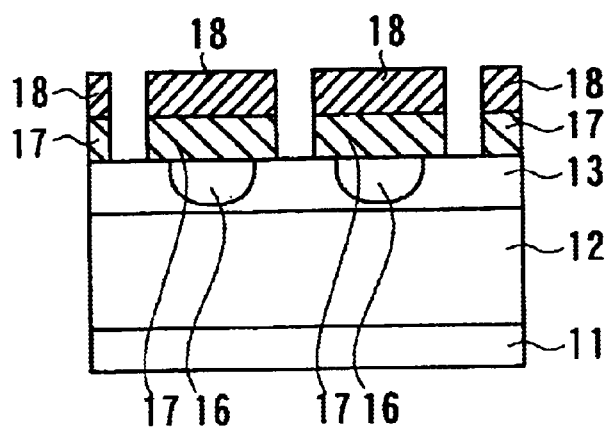
FIG. 8 is a cross-sectional view showing the subsequent process.
Figure 9:
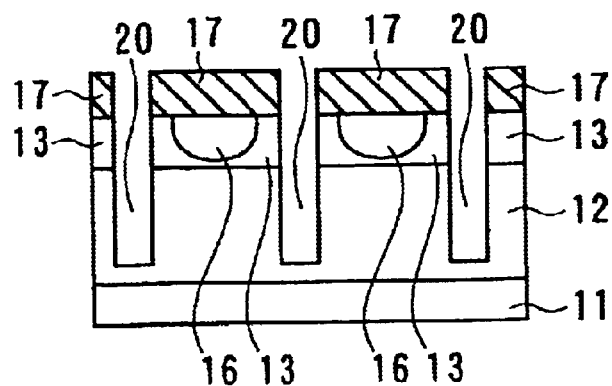
FIG. 9 is a cross-sectional view showing the subsequent process.

Subsequently, the SiO$_2$ film 17 is etched by using the resist film 18 as a mask to expose the surface of the P-body region 13 (refer to FIG. 8). Then, the resist film 18 is removed and the P-body region 13 and the drain layer 12 are etched by using the SiO$_2$ film 17 as a mask. Consequently, a plurality of slender deep trenches 20 having a rectangular cross section are formed from the SiO$_2$ film 17 to the drain layer 12 piercing the P-body region 13 (refer to FIG. 9). These deep trenches 20 are disposed in parallel to each other on the semiconductor substrate and are not brought into contact with the p$^+$-type diffusion regions 16. The bottom surface of the deep trench 20 is positioned lower than the upper end of the drain layer 12 at a depth of 12 $\mu$m from the surface of the semiconductor substrate.

Figure 10:
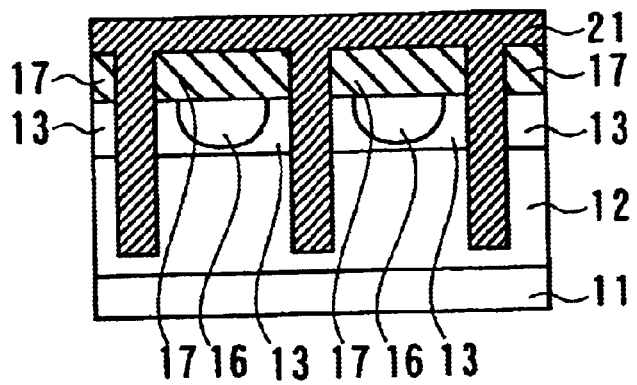
FIG. 10 is a cross-sectional view showing the subsequent process.
Figure 11:
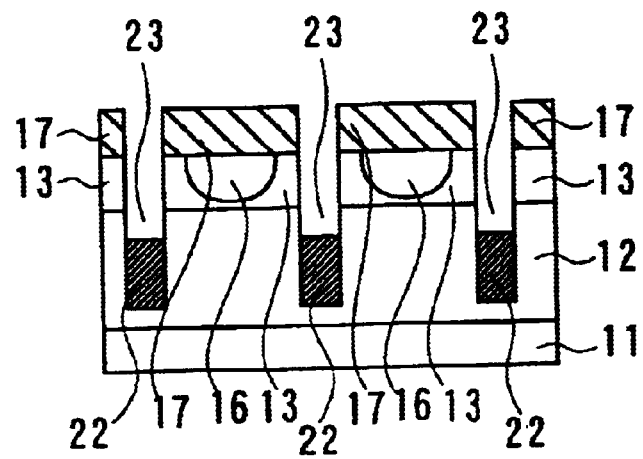
FIG. 11 is a cross-sectional view showing the subsequent process.
Figure 12:
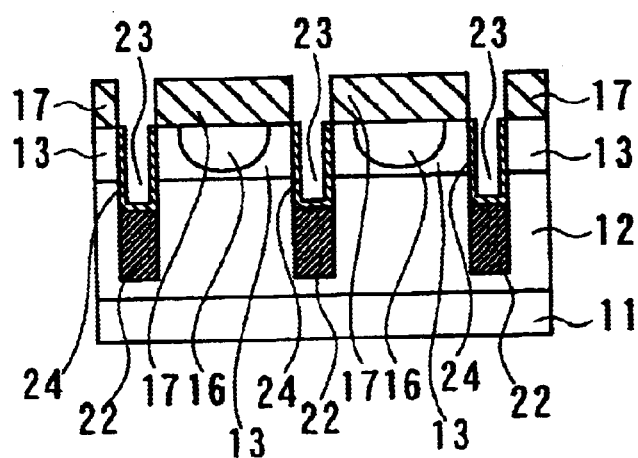
FIG. 12 is a cross-sectional view showing the subsequent process.

Subsequently, when a polysilicon thin film 21 in which boron are doped is deposited from the surface of the SiO$_2$ film 17 to the inside of the deep trench 20, the inside of the deep trench 20 is filled with the formed polysilicon thin film 21 (refer to FIG. 10).

Subsequently, the polysilicon thin film 21 is etched for a predetermined time period to remove the polysilicon thin film 21 on the SiO$_2$ film 17, but etching is finished while the polysilicon thin film 21 remains in the deep trench 20. Thus, the semiconductor material 22 of the present invention is constituted by the polysilicon thin film 21 remaining in the deep trench 20 (refer to FIG. 11). A plurality of the semiconductor materials 22 are formed in a slender shape and disposed in parallel to each other. The surface of the semiconductor material 22 is positioned lower than the surface of the drain layer 12, in practice, at a depth of 1.6 μm from the surface of the semiconductor substrate. In this state, the gate trench 23 of the present invention is constituted by a trench formed by the surface of the semiconductor material 22 and the inner peripheral surface of the deep trench 20. This gate trench 23 is formed in a slender shape as in the case of the deep trench 20. In this state, silicon is exposed on the inner peripheral surface of the gate trench 23. The surface of the semiconductor material 22 is exposed at the bottom of the gate trench 23.

Here, when the semiconductor material 22 is formed in the deep trench 20, the polysilicon thin film 21 is deposited to fill the inside of the deep trench 20, but the present invention is not limited to this constitution. For example, the semiconductor material 22 may be formed by growing epitaxial layer to be used as the semiconductor material 22 in the deep trench 20.

Subsequently, when thermal oxidation is performed, the inner surface of the gate trench 23 is oxidized. Consequently, a gate insulating film 24 is formed from the inner surface of the gate trench 23 over the surface of semiconductor material 22 (refer to FIG. 12).

Figure 13:
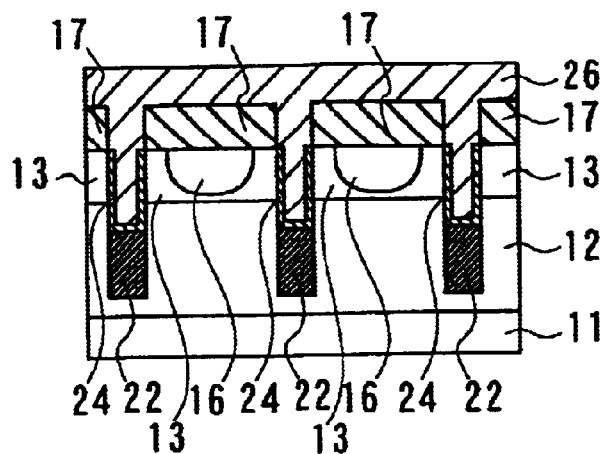
FIG. 13 is a cross-sectional view showing the subsequent process.
Figure 14:
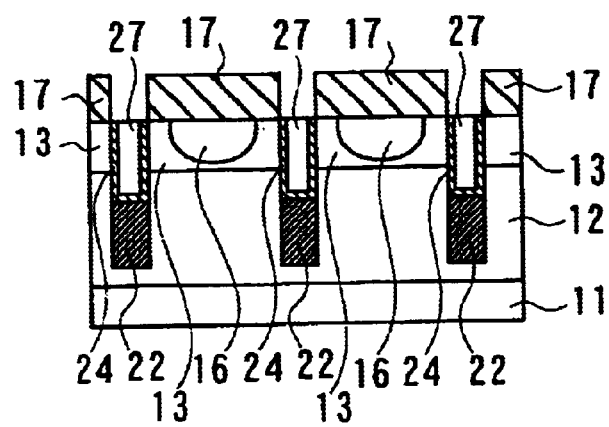
FIG. 14 is a cross-sectional view showing the subsequent process.

Subsequently, when a polysilicon thin film 26 into which phosphorus are doped is deposited from the surface of the $SiO_2$ film 17 over the inside of the gate trench 23, the inside of the gate trench 23 is filled with the polysilicon thin film 26 (refer to FIG. 13).

Subsequently, the polysilicon thin film 26 is etched for a predetermined time period to completely remove the polysilicon thin film 26 on the $SiO_2$ film 17. Etching is finished in a state that the polysilicon thin film 26 remains in the gate trench 23. Hereinafter, the polysilicon thin film 26 remaining in the gate trench 23 is referred to as a polysilicon gate and is designated by reference numeral 27 (refer to FIG. 14). A plurality of the polysilicon gates 27 are formed in a slender shape and disposed in parallel to each other. Its bottom surface is positioned lower than the surface of the drain layer 12.

Figure 15:
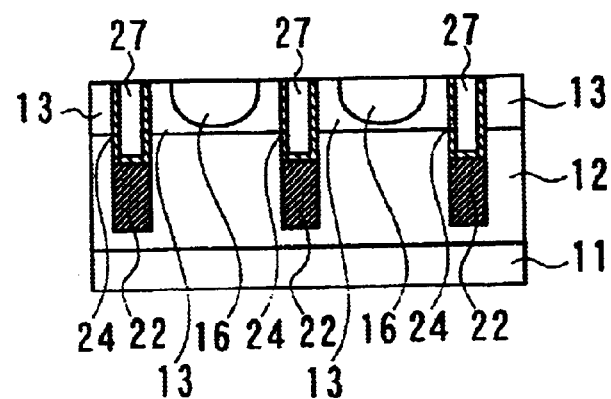
FIG. 15 is a cross-sectional view showing the subsequent process.
Figure 16:
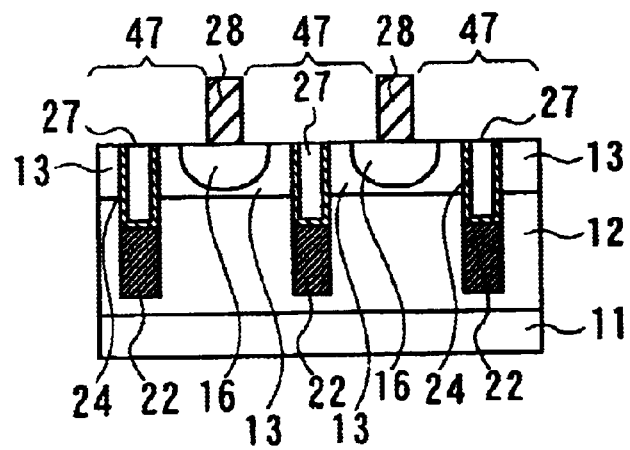
FIG. 16 is a cross-sectional view showing the subsequent process.

Subsequently, the $SiO_2$ film 17 is etched to expose a surface of the P-body region 13 (refer to FIG. 15). Then, a resist film 28 is formed. This resist film 28 is positioned at a central position of a short side of the $p^+$-type diffusion region 16, extends along a longitudinal direction and has slender apertures 47 formed therein (refer to FIG. 16). The $p^+$-type diffusion region 16 and the P-body region 13 are partially exposed from these apertures 47.

Figure 17:
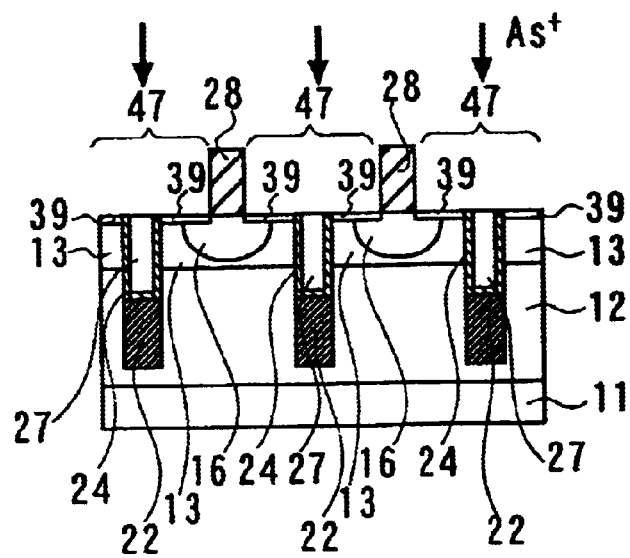
FIG. 17 is a cross-sectional view showing the subsequent process.
Figure 18:
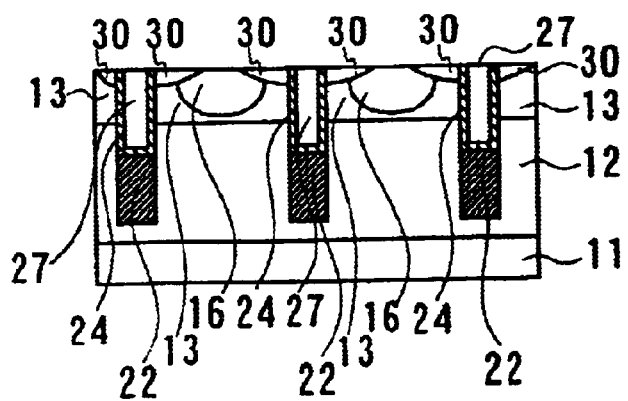
FIG. 18 is a cross-sectional view showing the subsequent process.
Figure 19:
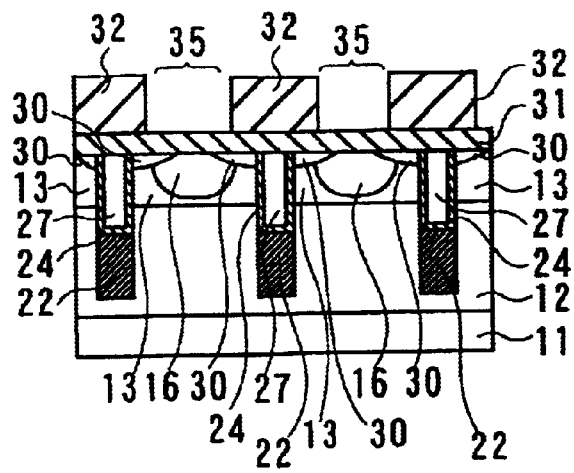
FIG. 19 is a cross-sectional view showing the subsequent process.
Figure 20:
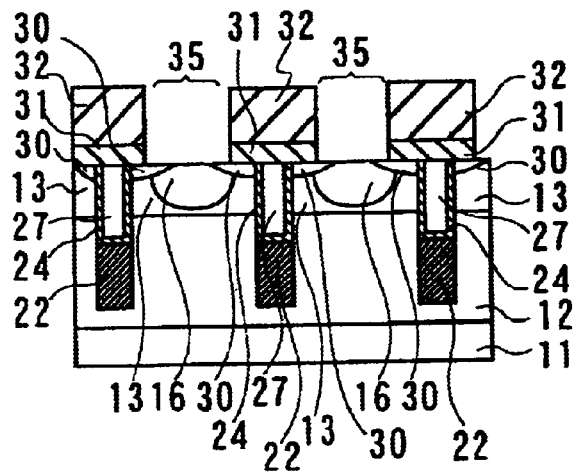
FIG. 20 is a cross-sectional view showing the subsequent process.

Then, when arsenic ions ($As^+$) are implanted in the surface of the P-body region 13 by using the resist film 28 as a mask, an $n^+$-type implantation layer 39 is formed on the $p^+$-type diffusion region 16 and the P-body region 13 partially exposed from the aperture 47 (refer to FIG. 17).

Subsequently, when the resist film 28 is removed and thermal process is performed, the $n^+$-type implantation layer 39 is diffused in the P-body region 13. A plurality of slender source regions 30 composed of an $n^+$-type impurities diffusion layer are formed from the surface of the P-body region 13 surrounding the gate trench 23 in the depth direction (refer to FIG. 18). These source regions 30 are disposed in parallel to each other on both sides of the slender $p^+$-type diffusion region 16 so as to cover long sides thereof.

Subsequently, a PSG film 31 is formed on the whole surface of the semiconductor substrate and then a resist film 32 is formed. The resist film 32 is patterned to form a plurality of slender apertures 35 above the $p^+$-type diffusion region 16 and part of the source region 30 (refer to FIG. 19).

Figure 21:
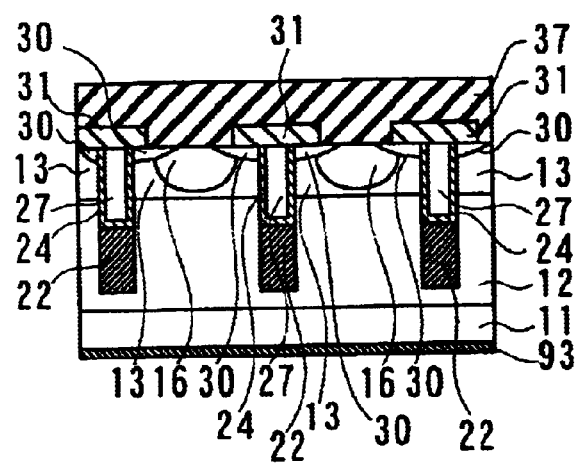
FIG. 21 is a cross-sectional view showing the subsequent process.

Subsequently, the PSG film 31 is etched by using the resist film 32 as a mask and the PSG film 31 is formed into a slender shape. At this time, the $p^+$-type diffusion region 16 and part of the source region 30 are exposed (refer to FIG. 20). Subsequently, an aluminum thin film is formed on the whole surface by evaporation to form a source electrode film 37. Then, a copper-nickel alloy thin film is formed on the bottom surface of the substrate by evaporation to form a drain electrode film 93. Thus, a power MOSFET 1 shown in FIG. 21 is formed.

In the power MOSFET 1 having a structure as described above, when a voltage equal to the threshold voltage or higher is applied between the polysilicon gate 27 and the source electrode film 37 in a state that a high voltage is being applied between the source electrode film 37 and the drain layer 12, an inversion layer is formed at the interface between the gate insulating film 24 and the P-body region 13 is formed. Thus, a current flows from the drain to the source through the inversion layer.

Figure 23:
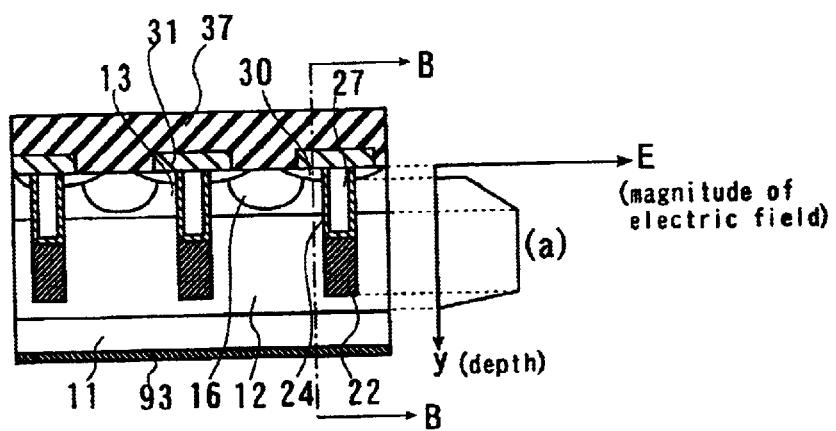
FIG. 23 is a cross-sectional view showing a power MOSFET according to one embodiment of the invention.

The abscissa axis (E) of a graph in FIG. 23 represents an electric field strength. The ordinate axis (y) represents a position on a line starting at an origin and vertically reaching the $n^+$-type silicon substrate 11 where the origin is the surface of the source regions 30 of a power MOSFET 1 shown in FIG. 23.

Line B—B in FIG. 23 starts at one point in the source region 30 and vertically reaches the $n^+$-type silicon substrate 11 through the P-body region 13 and the drain layer 12 without passing through the $p^+$-type diffusion region 16. A polygonal line (a) in FIG. 23 is a graph showing the relationship between a position on line B—B and the electric field strength thereat.

In the power MOSFET 1 of this embodiment, the semiconductor material 22 is disposed under the polysilicon gate 27 via the gate insulating film 24. Therefore, a depletion layer is also formed in the semiconductor material 22 under the polysilicon gate 27. As a result, the electric field strengths E from the interface between the P-body region 13 and the drain layer 12 to the bottom surface of the semiconductor material 22 become uniform as shown in FIG. 23.

Consequently, a high electric field is not applied to the interface between the P-body region 13 and the drain layer 12. Lower electric field than in a case of a conventional transistor are applied from the interface between the P-body region 13 and the drain layer 12 to the bottom surface of the semiconductor material 22 when the same voltage as that of a power MOSFET with a conventional structure is applied. Therefore, an avalanche breakdown voltage becomes higher than a conventional one.

Thus, since the avalanche breakdown voltage is higher, a concentration of impurities in the drain layer 12 does not need to be lowered to secure a desired avalanche breakdown voltage unlike the case of the conventional one. The concentration of impurities in the drain layer 12 can be made higher than that in the conventional transistor. Therefore, the on-resistance $R_{ON}$ of the power MOSFET 1 can be made lower than that of a conventional one.

Figure 22:
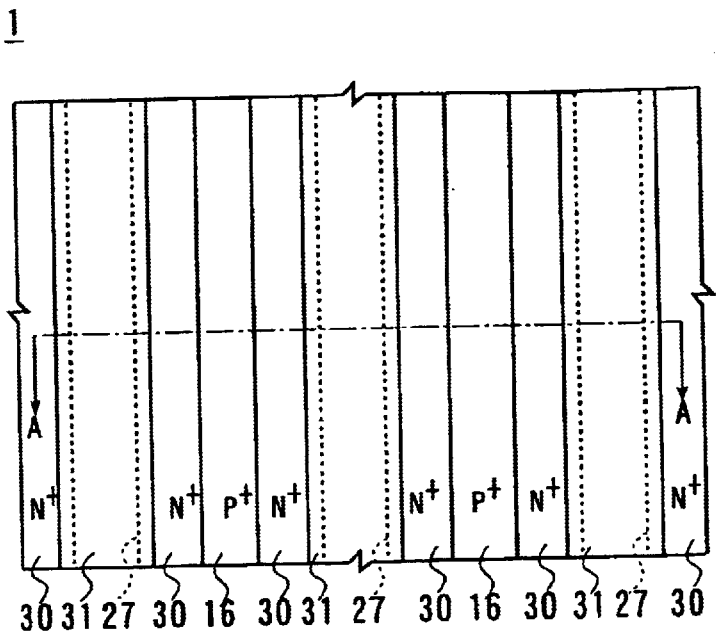
FIG. 22 is a plan view showing a power MOSFET according to one embodiment of the invention.

FIG. 22 is a plan view of a power MOSFET 1. A source electrode film 37 is not shown in FIG. 22. A plurality of slender rectangular PSG films 31 are formed in parallel to each other at predetermined intervals on a semiconductor substrate. $P^+$-type diffusion regions 16 in stripes are formed between the adjacent PSG films 31. Source regions 30 disposed on both sides of the $p^+$-type diffusion regions 16.

The power MOSFET 1 of this embodiment has diffusion layers formed in stripes on a plane as shown in FIG. 22, but a plan configuration of a transistor according to the present invention is not limited to the structure shown in FIG. 22.

Figure 24:
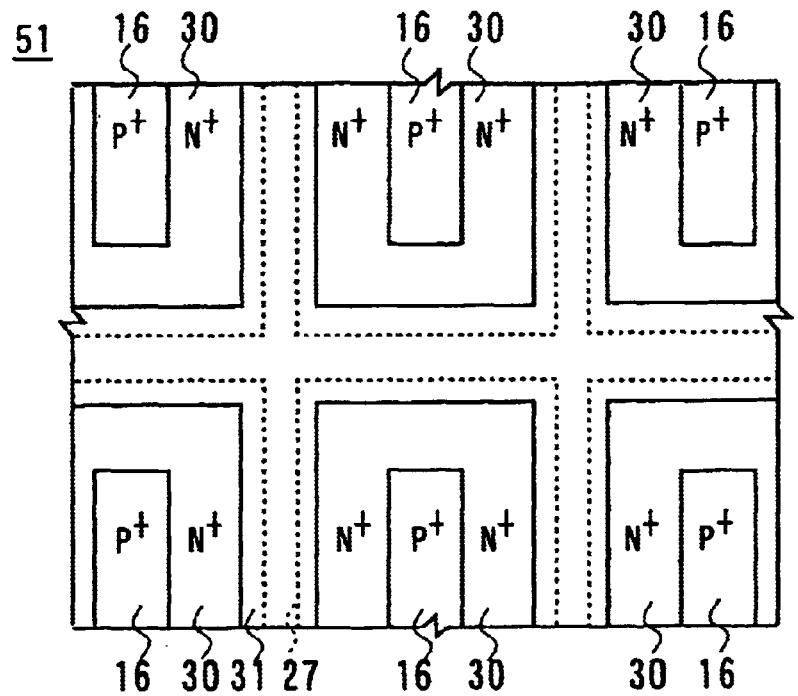
FIG. 24 is an explanatory view of a first example of a plan configuration of a power MOSFET according to one embodiment of the invention.

For example, as shown with reference numeral 51 in FIG. 24, gate trenches 23 may be formed in a mesh to form gate electrodes 27 in a grid. A source region 30 in a rectangular shape may be formed in each region surrounded by the gate electrodes 27 while a rectangular p+-type diffusion region 16 is formed at the center of each source region 30.

Also, a power MOSFET may have the following configuration. As a plan configuration is shown with reference numeral 71 in FIG. 25, polysilicon gates 27 are buried in rectangular gate trenches arranged in a line. A gate electrode interconnect layer 81 in stripes composed of polysilicon is formed on each polysilicon gate 27. Source regions 30 in stripes are disposed on both sides of the gate electrode interconnect layer 81. P+-type diffusion regions 16 in stripes are formed between the neighboring source regions 30.

Figure 25:
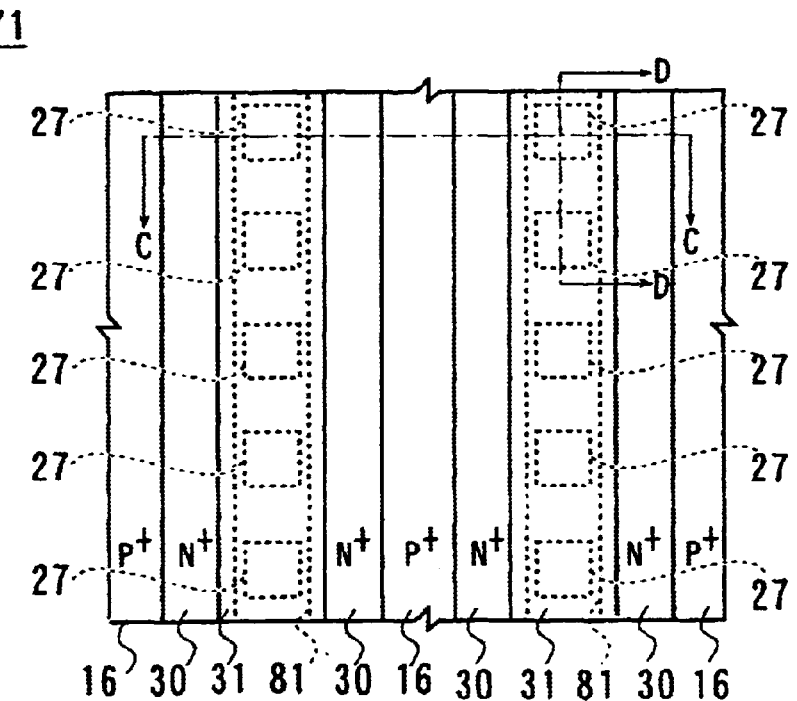
FIG. 25 is an explanatory view of a second example of a plan configuration of a power MOSFET according to one embodiment of the invention.
Figure 26:
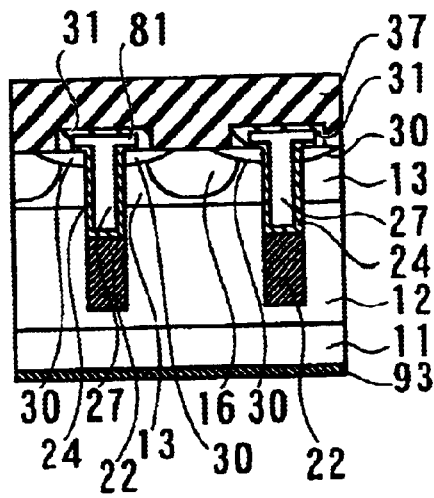
FIG. 26 is a cross-sectional view taken along line C—C in FIG. 25.
Figure 27:
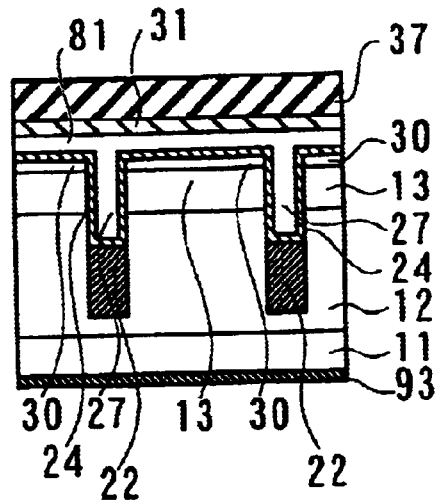
FIG. 27 is a cross-sectional view taken along line D—D in FIG. 25.

FIG. 26 is a cross-sectional view taken along line C—C in FIG. 25. FIG. 27 is a cross-sectional view taken along line D—D in FIG. 25. Since respective polysilicon gates 27 are connected with each other by a gate electrode interconnect layer 81 provided in a line thereon, a voltage can be applied to all the polysilicon gates 27 by applying the voltage to the gate electrode interconnect layer 81.

Figure 28:
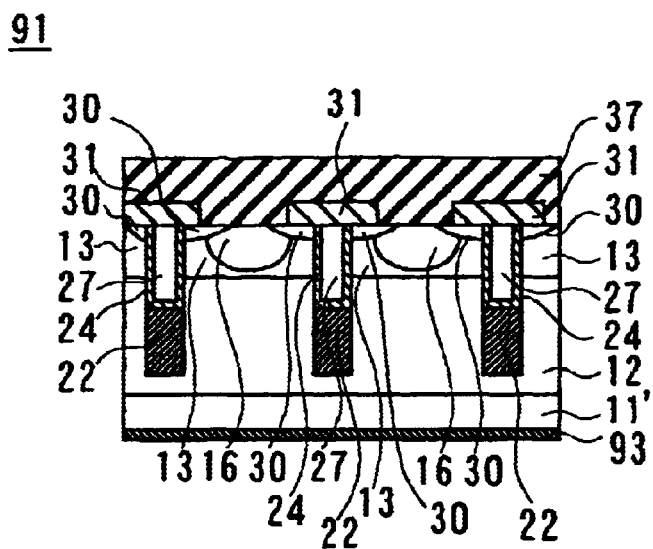
FIG. 28 is a cross-sectional view showing an example of an IGBT according to the present invention.
Figure 29:
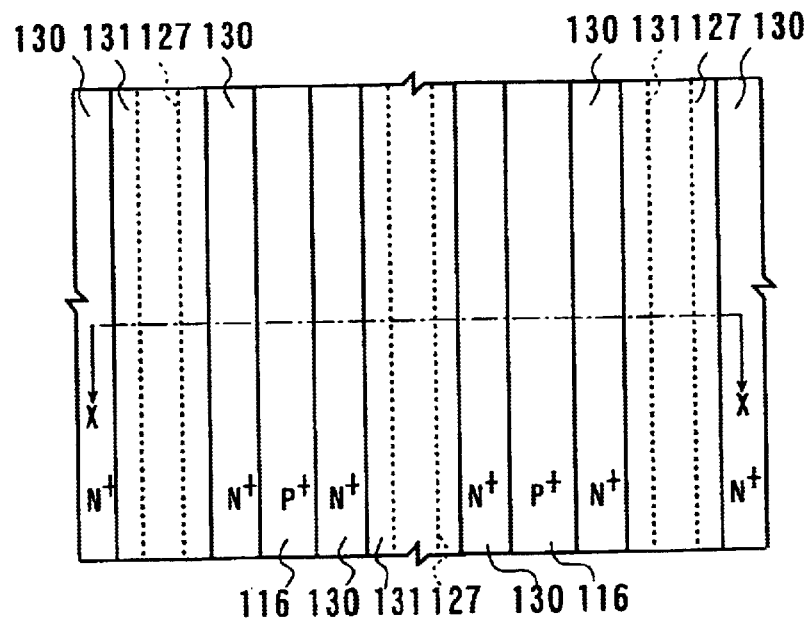
FIG. 29 is a plan view showing a conventional power MOSFET.
Figure 30:
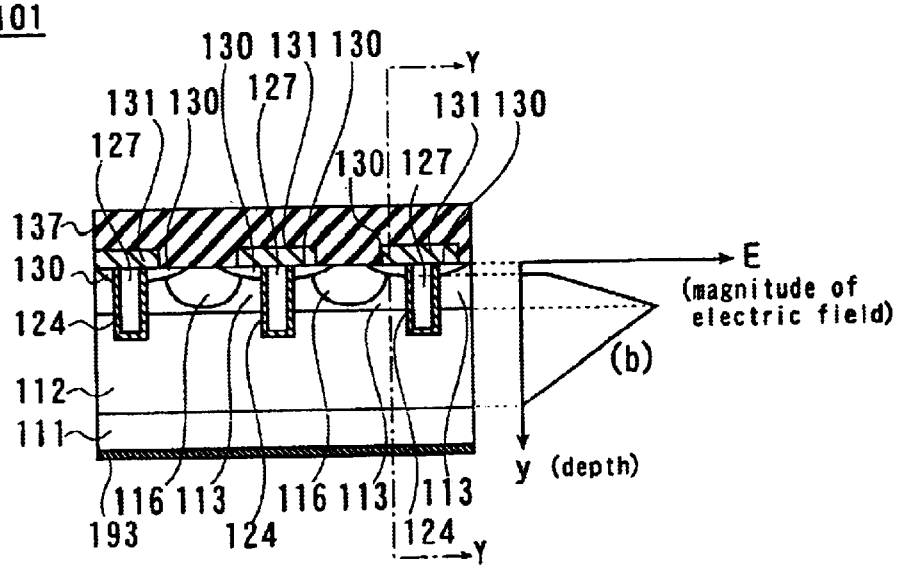
FIG. 30 is a cross-sectional view showing the conventional power MOSFET.

Furthermore, a power MOSFET is described as a transistor according to this embodiment, but the present invention is not limited to this kind of transistor. For example, the present invention can be applied to an IGBT (insulated gate bipolar transistor) 91 constituted by using a p+-type silicon substrate 11' instead of n-type silicon substrate 11 as shown in FIG. 28.

In this embodiment, n-type is defined as a first conductivity type and p-type is defined as a second conductivity type. An example of an opposite conductive region of the present invention is constituted by a p-type body region 13 and a p+-type diffusion region 16. However, the present invention is not limited to this definition. P-type may be a first conductivity type and n-type may be a second conductivity type.

An aluminum film is used as a source electrode film 37, but the present invention is not limited to this kind of film. For example, a copper film or the like may be used.

Furthermore, a drain layer 12 is formed by epitaxial growth, but a method of forming a drain layer 12 according to the present invention is not limited to this method. The drain layer 12 may be formed by surface diffusion.

In any of the above-described embodiment, a silicon substrate is used as a semiconductor substrate, but a semiconductor substrate of the present invention is not limited to this kind of substrate. For example, a substrate of SiC or the like may be used.

Furthermore, in this embodiment, polysilicon to which phosphorus (p) are doped is used as a semiconductor material 22, but the present invention is not limited to this. Silicon single crystal to which impurities of a conductivity type opposite to that of impurities added to drain layer 12 is added may be used.

A polysilicon gate is used as gate electrode film, but a gate electrode of the present invention is not limited to this kind of gate. A metal gate may be used.

Furthermore, a P-body region 13 is formed by surface diffusion, but the present invention is not limited to this method. For example, the P-body region may be formed by epitaxial growth.

A silicon oxide film is used as a gate insulating film 24, but a gate insulating film 24 of the present invention is not limited to this kind of film. For example, a silicon nitride film may be used or a composite film of a silicon oxide film and a silicon nitride film may be used.

A transistor of the present invention is not limited to the power MOSFET 1 shown in FIG. 23. For example, like a power MOSFET shown with reference numeral 61 in FIG. 33, a structure in which an insulating film 65 is disposed between a semiconductor material 22 and a deep trench 20 may be employed.

In this power MOSFET 61, a semiconductor material 22 and a drain layer 12 are insulated from each other. Therefore, even when the power MOSFET 61 is reverse biased, no current flows between the drain layer 12 and the semiconductor material 22. As a result, leakage current is lower than in an element in which an insulating film 65 is not formed such as, for example, a power MOSFET 1 shown in FIG. 21. Thus, loss of power consumption is reduced.

A manufacturing process of a power MOSFET 61 having this structure will be briefly described below.

Figure 31:
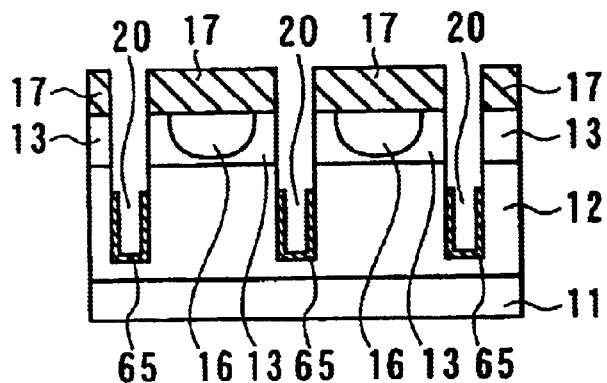
FIG. 31 is a cross-sectional view showing a manufacturing process of a power MOSFET according to another embodiment of the invention.

First, after the steps shown in FIGS. 1 to 9, the inside of an exposed deep trench 20 is subjected to thermal oxidation to form an oxide film from the inner bottom surface of the deep trench 20 to the inner side surface. The oxide film is etched to form an insulating film 65 which is formed from the inner bottom surface of the deep trench 20 to the inner side surface and has upper end positioned lower than the surface of the drain layer 12. FIG. 31 shows this state.

Subsequently, polysilicon is deposited on the surface of the insulating film 65 and the inside of the deep trench 20 to fill the deep trench 20. Then, the polysilicon is etched until the upper end of the polysilicon is positioned at the same depth as the upper end of the insulating film 65. Thus, a semiconductor material 22 composed of polysilicon is formed.

Figure 32:
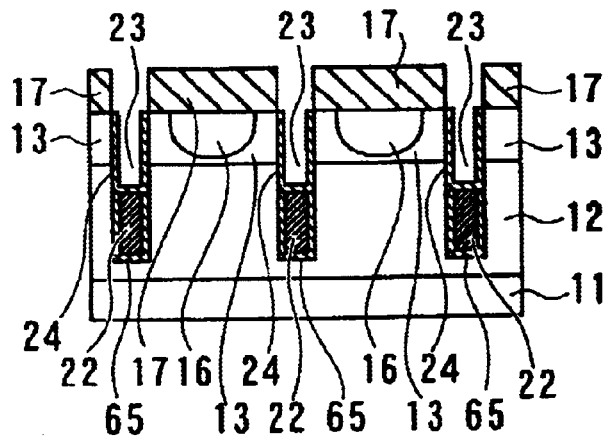
FIG. 32 is a cross-sectional view showing a manufacturing process of a power MOSFET according to another embodiment of the invention.

Subsequently, when thermal oxidation is performed, the surface of the semiconductor material 22 and the inner peripheral surface of the gate trench 23 are oxidized and thereby a gate insulating film 24 is formed. FIG. 32 shows this state.

Figure 33:
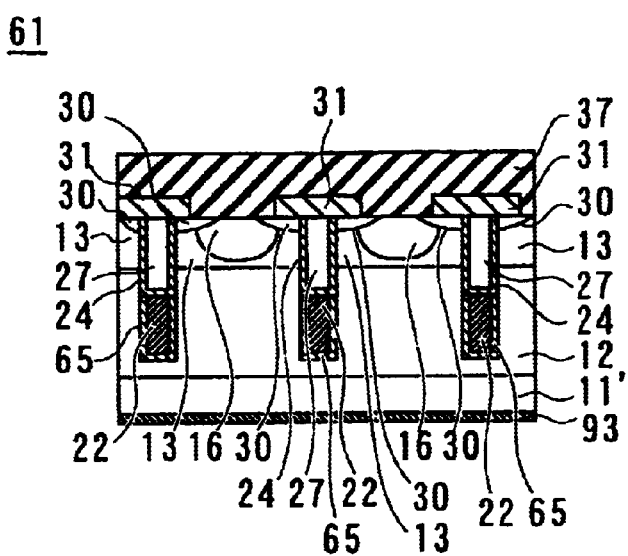
FIG. 33 is a cross-sectional view showing a power MOSFET according to another embodiment of the invention.

Subsequently, after steps similar to those shown in FIGS. 13 to 21, a power MOSFET 61 shown in FIG. 33 is completed.

The on-resistance can be reduced by increasing the avalanche breakdown voltage of a power MOSFET.

What is claimed is:

1. A method of manufacturing a transistor having a semiconductor substrate having a drain layer of a first conductivity type and an opposite conductive region of a second conductivity type in contact with the drain layer; comprising steps of:

forming a deep trench reaching from a surface of the opposite conductive region to the drain layer in the semiconductor substrate, wherein a bottom of deep trench is positioned in the drain layer;

disposing a semiconductor filler of the second conductivity type on a bottom of the deep trench, wherein top of the semiconductor filler is deeper than a bottom of the opposite conductive region;

forming a gate insulating film on an inner side surface of a gate trench composed of an upper part than the top of semiconductor filler in the deep trench;

forming a gate electrode insulated from the semiconductor filler in the gate trench to contact with the gate insulating film, and forming a source region of the first conductivity type on a surface within the opposite conductive region to contact with the gate insulating film.

2. The method of manufacturing a transistor according to claim 1, after growing a semiconductor material to a shallower position than a depth of the opposite conductive region in the deep trench, and forming the semiconductor filler with removing an upper portion of the semiconductor material.

3. The method of manufacturing a transistor according to claim 2, after forming the gate insulating film on the inner side surface and the bottom surface of the deep trench, growing the semiconductor material in the deep trench, before forming the gate insulating film, removing an upper portion of the insulating film, exposing the opposite conductive region on the inner side surface of the gate trench and forming the gate insulating film on the exposed the opposite conductive region.

4. The method of manufacturing a transistor according to claim 2, exposing the drain layer in the deep trench, growing the semiconductor material and forming a pn junction between the semiconductor filler and the dram layer.

5. The method of manufacturing a transistor according to claim 2, growing a silicon single crystal containing impurities of the second conductivity type as the semiconductor material.

6. The method of manufacturing a transistor according to claim 2, growing a polysilicon containing impurities of the second conductivity type as the semiconductor material.

7. The method of manufacturing a transistor according to claim 1, wherein the opposite conductive region is formed by diffusing impurities of the second conductivity type from a part of surface of the drain layer.

8. The method of manufacturing a transistor having a drain layer of a first conductivity type, an opposite conductive region of a second conductivity type in contact with the drain layer, a gate trench formed on a deeper position than a depth of the opposite conductive region on a surface of the opposite conductive region, a gate insulating film disposed on an inner side surface of the gate trench, a gate electrode disposed on an inside of the gate trench and insulated from the opposite conductive region by the gate insulating film, a source region of the first conductivity type on a surface within the opposite conductive region to contact with the gate insulating film and comprising the steps of:

forming a deep trench having a deeper depth than a depth of the gate trench, and disposing a semiconductor filler of the second conductivity type on inside of the deep trench, thereby making an upper part than a top of the semiconductor filler into the gate trench.

9. The method of manufacturing a transistor according to claim 8, after growing the semiconductor material of the second conductivity type in the deep trench, removing the upper portion of the semiconductor material and forming the semiconductor filler.

10. The method of manufacturing a transistor according to claim 9, after forming the gate insulating film on the inner side surface and the bottom surface of the deep trench, growing the semiconductor material in the deep trench, before forming the gate insulating film, removing the upper portion of the insulating film, exposing the opposite conductive region on the inner side surface of the gate trench and forming the gate insulating film on the exposed opposite conductive region.

11. The method of manufacturing a transistor according to claim 9, exposing the drain layer in the deep trench, growing the semiconductor material and forming a pn junction between the semiconductor filler and the drain layer.

12. The method of manufacturing a transistor according to claim 9, growing the silicon single crystal containing impurities of the second conductivity type as the semiconductor material.

13. The method of manufacturing a transistor according to claim 9, growing the polysilicon containing impurities of the second conductivity type as the semiconductor material.

14. The method of manufacturing a transistor according to claim 8, wherein the opposite conductive region is formed by diffusing impurities of the second conductivity type from a part of surface of the drain layer.

* * * * *